(12) United States Patent
Chiang

(10) Patent No.: US 7,922,359 B2
(45) Date of Patent: Apr. 12, 2011

(54) LIQUID-FILLED LED LAMP WITH HEAT DISSIPATION MEANS

(75) Inventor: Kun-Yuan Chiang, Taipei (TW)

(73) Assignee: Liquidleds Lighting Corp., George Town (KY)

( * ) Notice: Subject to any disclaimer, the term of this patent is extended or adjusted under 35 U.S.C. 154(b) by 127 days.

(21) Appl. No.: 11/487,386

(22) Filed: Jul. 17, 2006

(65) Prior Publication Data
US 2008/0013316 A1    Jan. 17, 2008

(51) Int. Cl.
F21V 15/01    (2006.01)
F21V 33/00    (2006.01)

(52) U.S. Cl. ........ 362/294; 362/101; 362/373; 362/547; 362/249.02; 165/104.33

(58) Field of Classification Search ................ 362/580, 362/547, 218, 264, 294, 345, 373, 96, 101, 362/154, 267, 241, 243, 245, 247, 555, 800, 362/260, 216; 313/512; 40/541; 257/98, 257/100; 165/104.33
See application file for complete search history.

(56) References Cited

U.S. PATENT DOCUMENTS

| | | | |
|---|---|---|---|
| 5,890,794 A * | 4/1999 | Abtahi et al. | 362/294 |
| 7,111,963 B2 * | 9/2006 | Zhang | 362/294 |
| 2004/0004435 A1 * | 1/2004 | Hsu | 313/512 |
| 2006/0176699 A1 * | 8/2006 | Crunk | 362/294 |
| 2006/0274524 A1 * | 12/2006 | Chang et al. | 362/231 |
| 2007/0008713 A1 * | 1/2007 | Doyle | 362/101 |
| 2007/0091632 A1 * | 4/2007 | Glovatsky et al. | 362/547 |

FOREIGN PATENT DOCUMENTS

| | | |
|---|---|---|
| DE | 3508480 | 9/1986 |
| DE | 202005013612 | 11/2005 |
| KR | 2006-43589 | 5/2006 |

OTHER PUBLICATIONS

Extended European search report in English from European Patent Office, mailed Jan. 2, 2008, in copending App. No. EP 07111685.
Office Action from Korean Patent Office, mailed Dec. 5, 2008, in copending App. No. 10-2007-0070766 and English-language translation thereof.
Notice of intension of grant from European Patent Office, mailed Oct. 28, 2009, in counterpart App. No. EP 07111685.

* cited by examiner

Primary Examiner — Ismael Negron
(74) Attorney, Agent, or Firm — Finnegan Henderson Farabow Garrett & Dunner LLP

(57) ABSTRACT

An LED lamp includes a container having a cavity containing a liquid, a light source module with a high power LED source to emit light through the liquid, and an thermal conductor having a first portion proximate the light source module and a second opposite portion extending in an axial direction of the cavity in front of the light source module.

19 Claims, 16 Drawing Sheets

LIQUID-FILLED LED LAMP WITH HEAT DISSIPATION MEANS

FIELD OF THE INVENTION

The present invention is related generally to a lamp and, more particularly, to a high power light-emitting diode (LED) lamp for illumination purpose.

BACKGROUND OF THE INVENTION

Due to its long lifetime, power saving and environment protection, LED has been widely used in decorative lamps such as underwater lights and indicative lamps such as traffic lights. However, it is still not suitable for illumination purpose since the brightness per unit power consumption it generates is not high enough, the heat dissipation it is provided with is not efficient enough, and the emission angle of lights it radiates is not wide enough. Along with the improvement of white LED, the brightness per unit power consumption is gradually enhanced. Recently, for example, it is commercialized of white LED brighter than traditional incandescent bulb, which is up to 30 lm/W, and it is also expected in a few days the commercialization of white LED brighter than fluorescent tube, which is about 100 lm/W. Therefore, the heat dissipation and the lighting angle are the problems to be solved for using LED in luminaries.

FIG. 1 shows a typical low power LED 100, which comprises a lens-effective epoxy resin 110 covering over a semiconductor die 102, and a pair of anode pin 106 and cathode pin 108 electrically connected to the semiconductor die 102 through electrodes and a gold wire 104. The heat produced by the low power LED 100 is so tiny that it could be well dissipated by conducting through the pair of anode pin 106 and cathode pin 108 to the copper foil of the printed circuit board (not shown in FIG. 1) that the low power LED 100 is mounted for further dissipating to the air of the environment. This type of low power LED 100 has the power consumption less than 0.3-0.4 W and is applied for decorative lamps and indicative lamps. FIG. 2 shows a conventional low power LED lamp 112, which comprises a standard bulb base 120 bounded with a shell 122, a printed circuit board 116 fixed within the shell 122, several low power LED packages 100 welded on the printed circuit board 116, a layer of resin 114 filling in the shell 122 to protect the printed circuit board 116 and the pins of the low power LED packages 100, and a power conversion and driving module 118 connected between the printed circuit board 116 and the base 120 for driving the low power LED packages 100. In the low power LED lamp 112, the heat produced by the low power LED packages 100 is conducted to the copper foil of the printed circuit board 116 and then dissipated therefrom, and no heat sink is provided. The shell 122 is made of either metal or plastic. However, the use of metal for the shell 122 is for mechanical strength but not for thermal conduction or heat dissipation.

FIG. 3 shows a conventional high power LED 124, in which a pair of anode pin 138 and cathode pin 140 are electrically connected to a semiconductor die 130 through electrodes and gold wires 132 and 133, a layer of resin 128 fixes the semiconductor die 130 on a heat sink 136, a plastic shell 134 contains the core structure, and an optical lens 126 is positioned on the resin 128 and bounded to the plastic shell 134. This type of high power LED 124 consumes more than 0.3 W, and because of the great heat generation, requires heat dissipation means for preventing the high power LED 124 from overheating. FIG. 4 shows a heat sink structure 142 for the high power LED 124, which comprises a metal core printed circuit board 144 attached to the heat sink 136, and fins 146 attached to the metal core printed circuit board 144 for heat dissipation. The heat produced by the high power LED 124 is conducted through the heat sink 136 and the metal core printed circuit board 144 to the fins 146, where the natural air convection dissipates the heat to the air of the environment. The heat sink 136 is made of good thermal conductor, such as metal, graphite, carbon fiber, ceramic and their compound. FIG. 5 shows a conventional front dissipation high power LED lamp 148, which comprises a reflective cup 150 made of highly thermally conductive metal whose outside surface is formed with ring fins 158, an optical lens 152 made of glass or plastic on the aperture of the reflective cup 150, a high power LED package 124 on the bottom of the reflective cup 150, and a power conversion and driving module 154 connected between the high power LED package 124 and a standard bulb base 156. The light emitted by the high power LED package 124 is reflected by the reflective cup 150 to pass through the optical lens 152, and the heat produced by the high power LED 124 is conducted by the reflective cup 150 to the fins 158 to dissipate therefrom by natural air convection. In this high power LED lamp 148, even though the fins 158 increase the heat dissipation area for air convection, the thermal conduction path is too long to fast dissipate the heat from the high power LED package 124 to the fins 158, resulting in the high power LED package 124 overheated. To solve this overheat problem, it is proposed a back dissipation structure as shown in FIG. 6, in which a back dissipation high power LED lamp 160 comprises an optical lens 162 over a high power LED package 124, and a heat pipe 164 connected between the high power LED package 124 and a power conversion and driving module 168. Fins 166 are formed on the heat pipe 164, and the power conversion and driving module 168 has a pair of power input terminals 170. The heat produced by the high power LED package 124 is conducted to the heat pipe 164 and dissipated by the fins 166 by natural air convection. Since the thermal conduction path is shorter, the heat pipe 164 is capable of faster dissipating the heat from the high power LED package 124 by the fins 166. However, an environment having excellent airflow is required for such back dissipation lamp 160 for better heat dissipation from the fins 166 by natural air convection. When the back dissipation high power LED lamp 160 is applied for illumination purpose, such as embedded and ceiling fitting, the environment will not have excellent airflow condition, and the heat dissipation is dramatically degraded accordingly. FIG. 7 is a perspective diagram of the back dissipation high power LED lamp 160 applied for an embedded fitting, where the high power LED lamp 160 is positioned within a lampshade 172 that is fixed between a floor plate 174 and a ceiling plate 176. Due to the high power LED lamp 160 covered by the lampshade 172, the air convection is limited by the lampshade 172, resulting in poor heat dissipation. FIG. 8 is a perspective diagram of the back dissipation high power LED lamp 160 applied for a ceiling fitting, where the high power LED lamp 160 is fixed between a floor plate 174 and a ceiling plate 176, and thus the natural air convection to enhance the heat dissipation is limited by the shallow space between the floor plate 174 and the ceiling plate 176. Once the number of the high power LED lamps 160 for a ceiling fitting is larger, the accumulated temperature increase will degrade the heat dissipation efficiency. Moreover, in the tropical zone or the subtropical zone, the air temperature between the ceiling plate 176 and the floor plate 174 is often higher than 40° C., which will significantly limit the heat dissipation for the high power LED lamp 160.

Thermal delivery could be attained by conduction, convection and radiation. In the high power LED lamp 148 and 160, for heat dissipation enhancement, it is only used thermal conduction provided by thermally conductive material and natural thermal convection caused by larger heat surface in air environment at room temperature. With the same heat dissipation surface, the dissipated heat by natural air convection is only ¼ to ¹⁄₁₀ time of that by forced air convection such as by a fan. In addition, to improve the dissipation efficiency, the heat sink for natural air convection is required to have greater gaps between the adjacent fins thereof, resulting in larger volume in space. With respective to the forced air convection, however, it is not practical in consideration of the lifetime and reliability of fan compared with the long-term reliability of high power LED. Therefore, the increasing power of LED for illumination purpose makes it more difficult to solve the heat dissipation problem.

Because the junction working temperature of high power LED is required lower than 120° C. to avoid overheating, and the brightness (in lumens) and the lifetime of high power LED both are inversely proportional to the junction working temperature, the enhancement of heat dissipation to reduce the junction working temperature of high power LED becomes the fundamental of the application of high power LED for illumination purpose. FIG. 9 shows the relationship between the brightness and the junction working temperature of high power LED, in which for an ideal case, the junction working temperature of high power LED is required lower than 95° C. for the brightness higher than 80%. FIG. 10 shows the relationship between the lifetime and the junction working temperature of high power LED, in which for an ideal case, the junction working temperature of high power LED is required lower than 95° C. for the lifetime longer than 50 khr.

The high power LED lamp 148 has another drawback of optical loss due to the multiple reflections of the light within the reflective cup 150 and the reflection on the lens 152 when light passes therethrough, which lowers the useful efficiency of the light emitted by the high power LED lamp 148.

U.S. Pub. No. 2004/0004435 proposed a packaged LED, which comprises a cap having a cavity to fill with a cooling liquid to package a LED chip such that the cooling liquid could provide heat dissipation by direct contacting the LED chip. In theoretic, it seems to be effective for heat dissipation enhancement; however, it will not be significantly effective in practice since the cooling liquid behaves only as a thermal conductor in this structure. It is known that a liquid has poorer thermal conductivity than a solid, and thereby the replacement of the conventional resin with the cooling liquid to directly contact the LED chip will degrade the heat dissipation. In further detail, the active junction on the LED chip works at a temperature of around 110° C. for high power applications, which will heat the cooling liquid around the active junction to a very high temperature and produce a temperature gradient through the cooling liquid to the cap. Since the cooling liquid is a poor thermal conductor, it will not fast transfer the heat from the LED chip to the ambient air. As a result, the cooling liquid around the active junction will become very hot, and the heat will be kept thereof. Another drawback is that the package is too small to contain a little of cooling liquid, and therefore nothing beneficial to heat dissipation is provided. Moreover, since the working temperature of the active junction on the LED chip is around 110° C., the active junction surrounded by the cooling liquid may become a bubble generator to further degrade the heat dissipation. Since the heat cannot be dramatically removed from the path through the cooling liquid, the heat produced by the LED chip is still dominantly transferred through the electrodes and wire to the pins as a conventional LED does. A further drawback may be introduced into this package. Since it is the bare chip contacted by the cooling liquid, the cooling liquid may damage the LED chip because of erosion.

Another issue is discussed in the following. FIG. 11 shows the spatial distribution of light emitted by a traditional incandescent lamp, in which there is more than 60% of the brightness within the angle of 280 degrees. FIG. 12 shows the spatial distribution of light emitted by a traditional high power LED, in which the angle for 60% of the brightness is 110 degrees. Therefore, another problem to be solved for high power LED applied for ambient lighting is wider and uniform illumination. Namely, there is a need of optical design to spread the effective lighting angle of high power LED for illumination purpose.

Accordingly, it is desired a high power LED lamp with improved heat dissipation, wider lighting angle and higher brightness.

SUMMARY OF THE INVENTION

One object of the present invention is to provide a high power LED lamp for illumination purpose.

Another object of the present invention is to provide a low cost high power LED lamp.

A further object of the present invention is to improve the heat dissipation of a high power LED lamp.

Yet another object of the present invention is to provide a high power LED lamp having wider lighting angle.

Still another object of the present invention is to improve the brightness of a high power LED lamp.

In a high power LED lamp, according to the present invention, a container has a cavity filled with a liquid, a light source module provides a high power LED source light to penetrate through the liquid, and an axial thermal conductor has a first portion nearby the light source module and a second portion extending in the liquid along an axial direction of the cavity to far away from the light source module. When the light source module warms up, the axial thermal conductor evenly transfers heat from the light source module through the liquid to the container. As a result, it is attained fast and great heat dissipation for the light source module.

The liquid enhances the heat dissipation, spreads the lighting angle and increases the brightness. Preferable, thermal convection is caused in the liquid for further enhancement of heat dissipation. It is a low cost approach, which costs only ⅕ to ¹⁄₁₀ time than the conventional metal fins. When the light emitted by the light source module penetrates through the liquid, it is diffused to spread the lighting angle, and the total reflection between the liquid and the container may have light focusing effect and increase the brightness.

BRIEF DESCRIPTION OF THE DRAWINGS

The present invention can be more fully understood by reading the subsequent detailed description and examples with references made to the accompanying drawings; wherein.

DETAILED DESCRIPTION OF THE INVENTION

Figure 1:
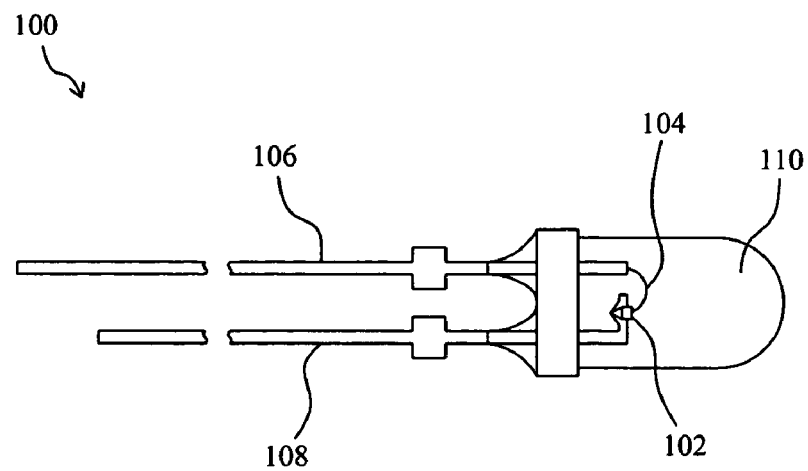
FIG. 1 shows a conventional low power LED.
Figure 2:
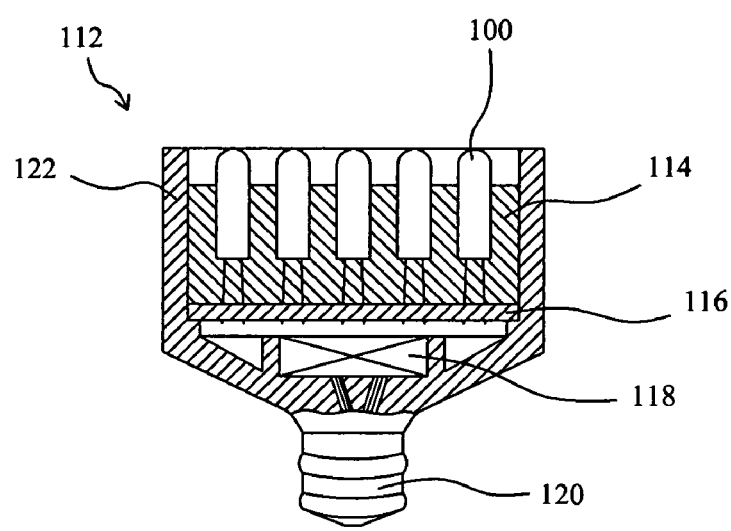
FIG. 2 shows a conventional low power LED lamp.
Figure 3:
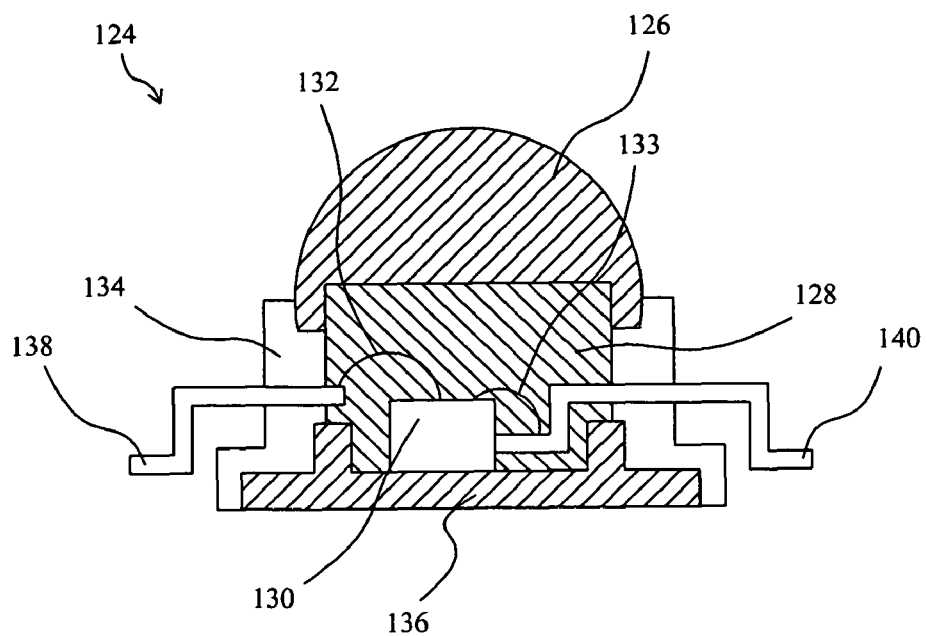
FIG. 3 shows a conventional high power LED.
Figure 4:
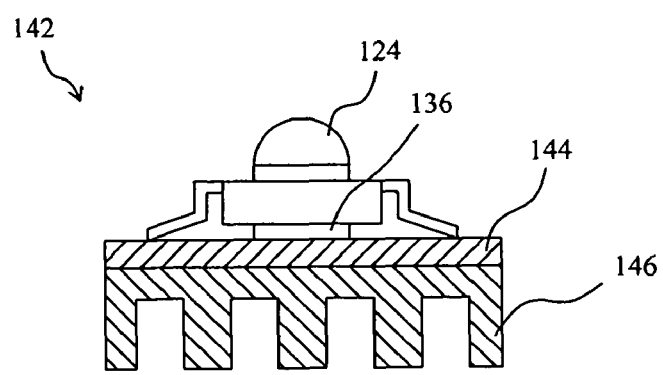
FIG. 4 shows a conventional heat sink structure for a high power LED.
Figure 5:
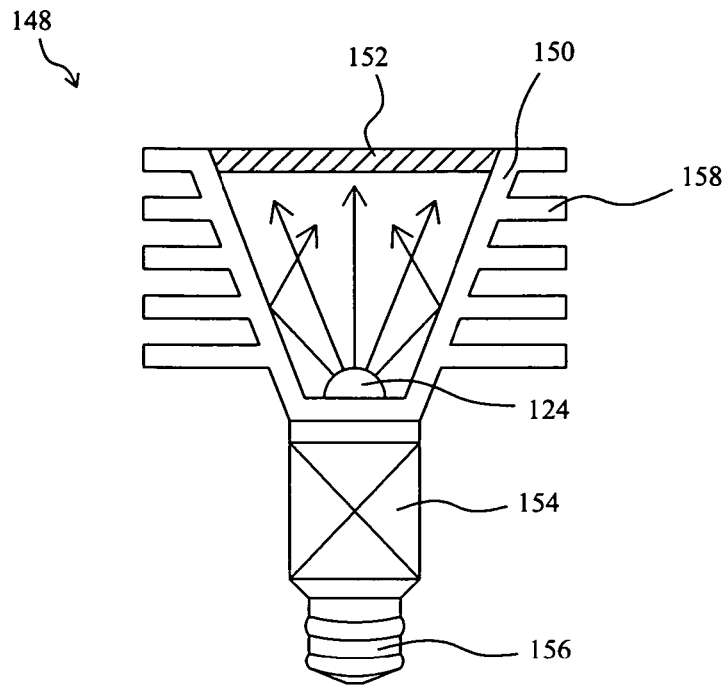
FIG. 5 shows a conventional front heat dissipation high power LED lamp.
Figure 6:
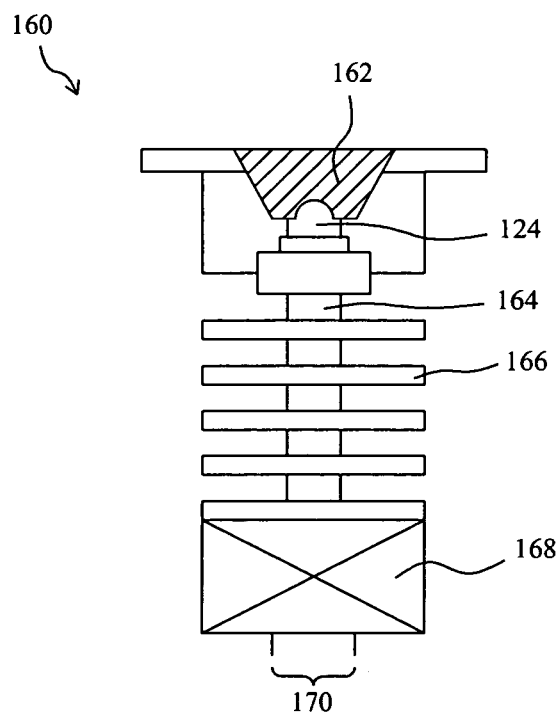
FIG. 6 shows a conventional back heat dissipation high power LED lamp.
Figure 7:
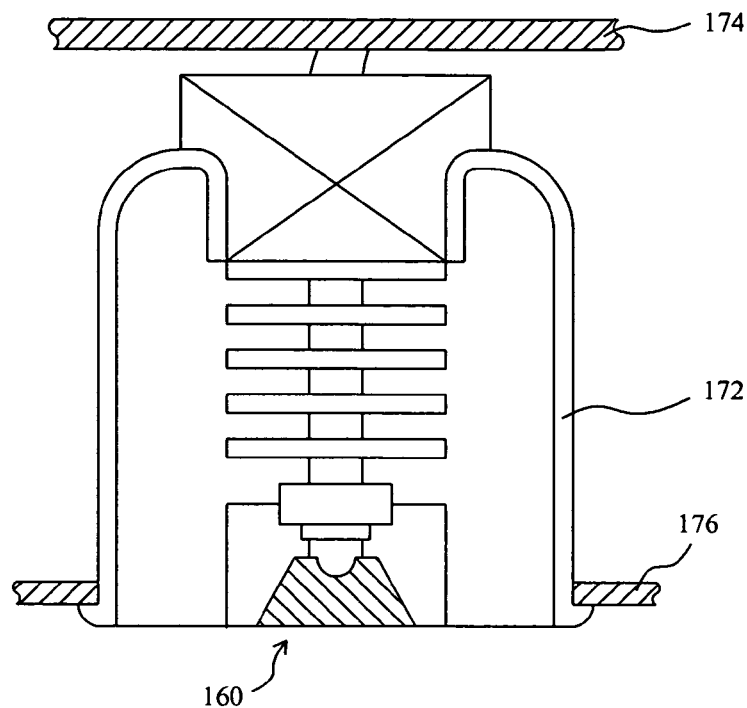
FIG. 7 is a perspective diagram of a conventional back heat dissipation high power LED lamp applied for embedded fitting.
Figure 8:
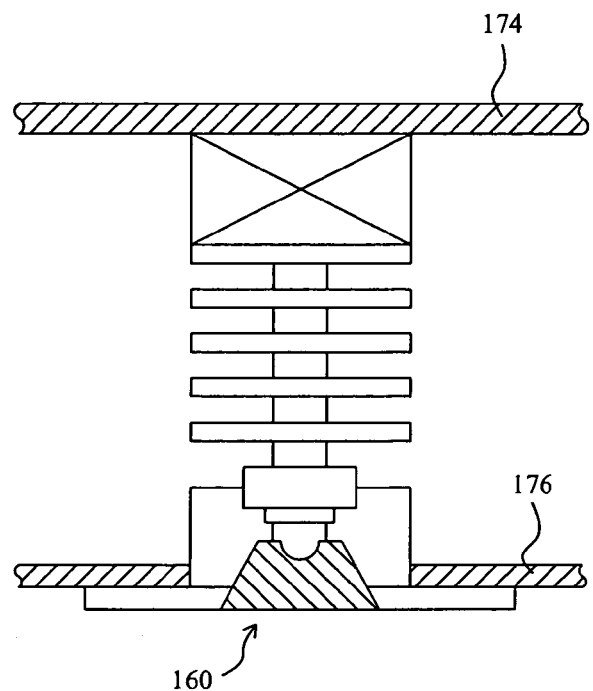
FIG. 8 is a perspective diagram of a conventional back heat dissipation high power LED lamp applied for ceiling fitting.
Figure 9:
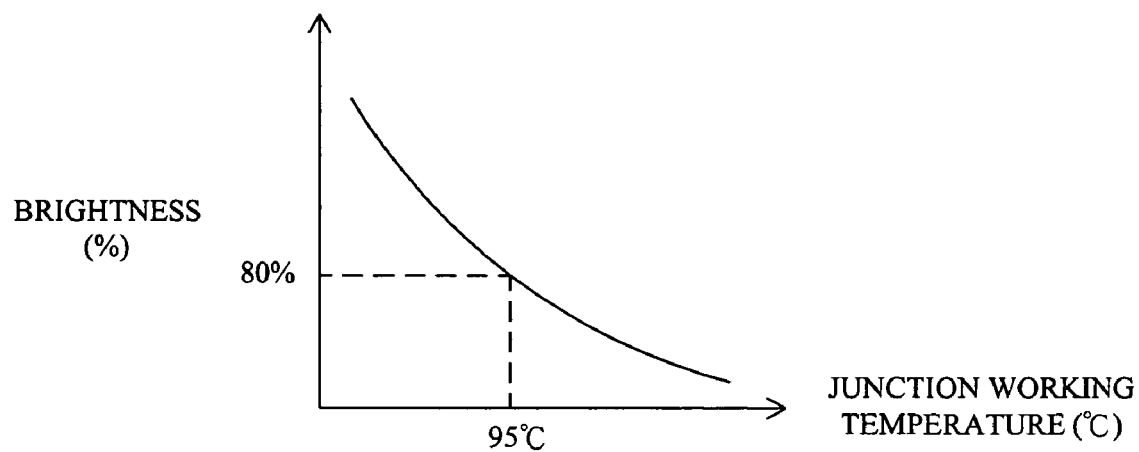
FIG. 9 shows the relationship between the brightness and the junction working temperature of high power LED.
Figure 10:
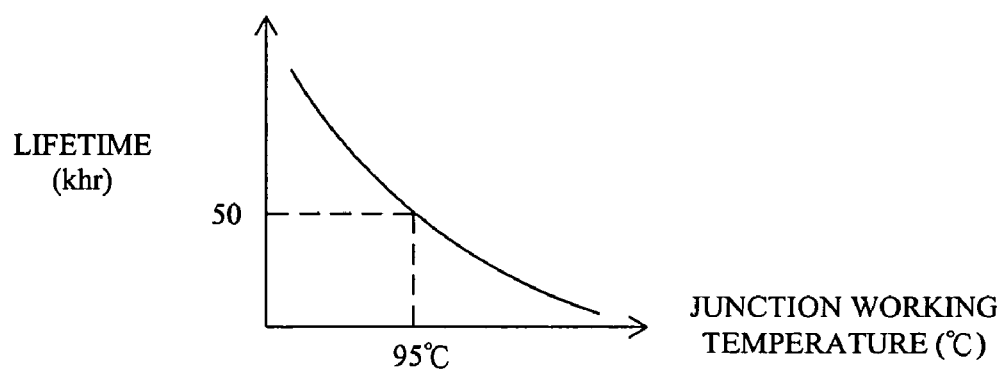
FIG. 10 shows the relationship between the lifetime and the junction working temperature of high power LED.
Figure 11:
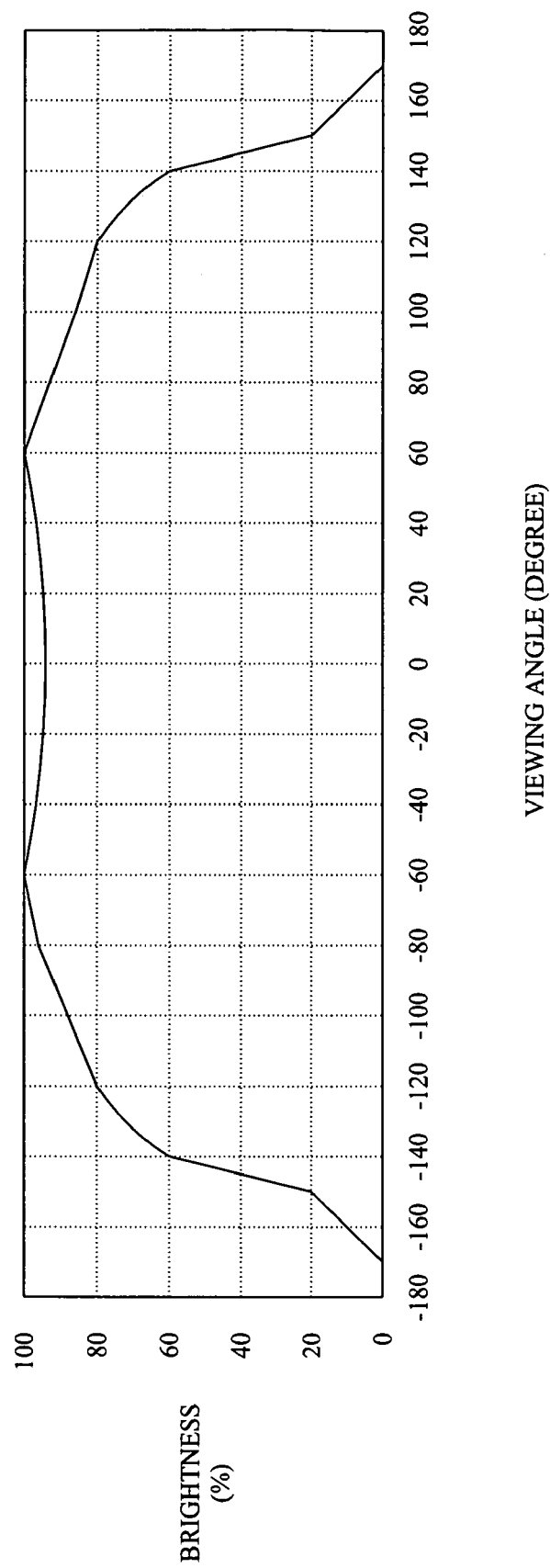
FIG. 11 shows the spatial distribution of light emitted by a traditional incandescent lamp.
Figure 12:
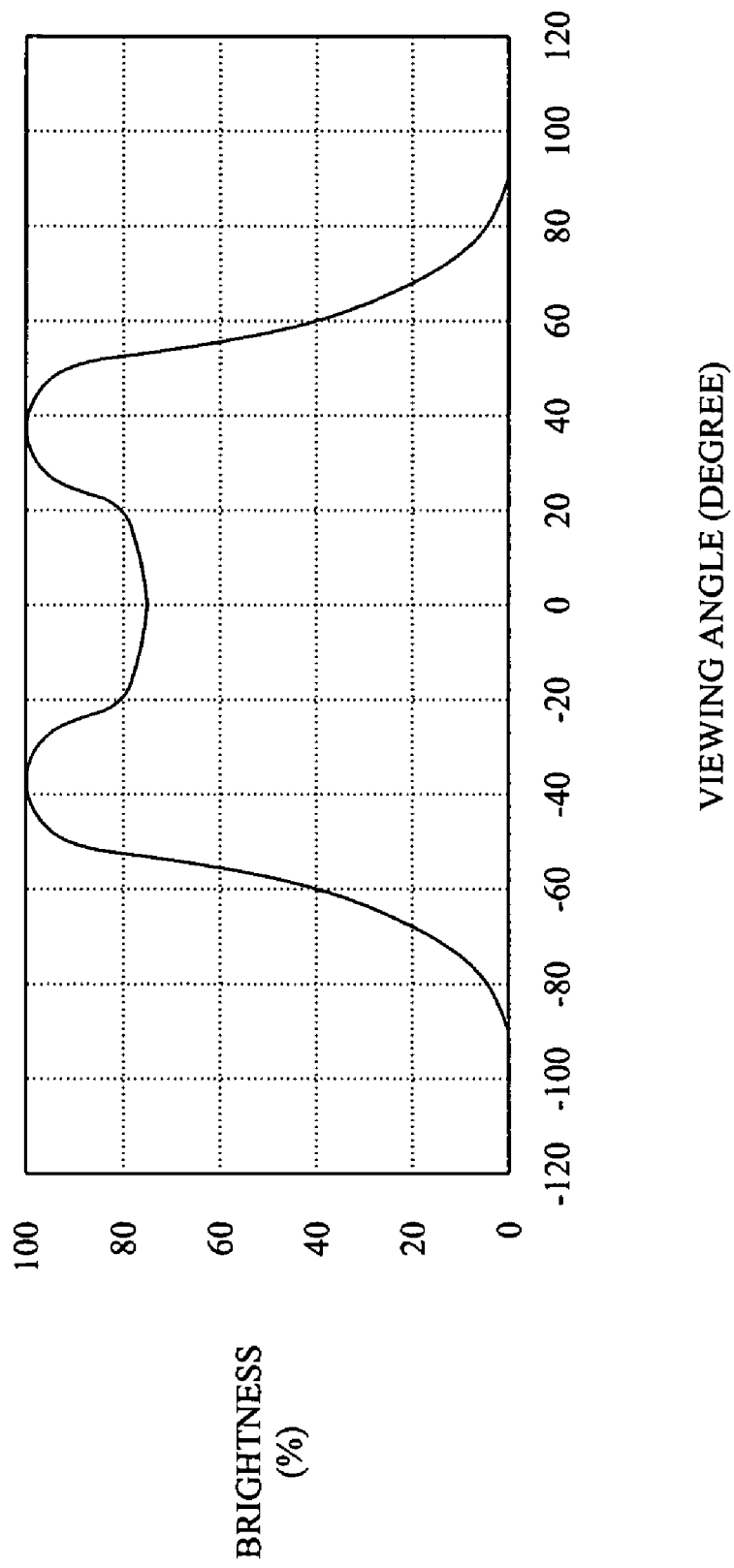
FIG. 12 shows the spatial distribution of light emitted by a traditional high power LED.
Figure 13:
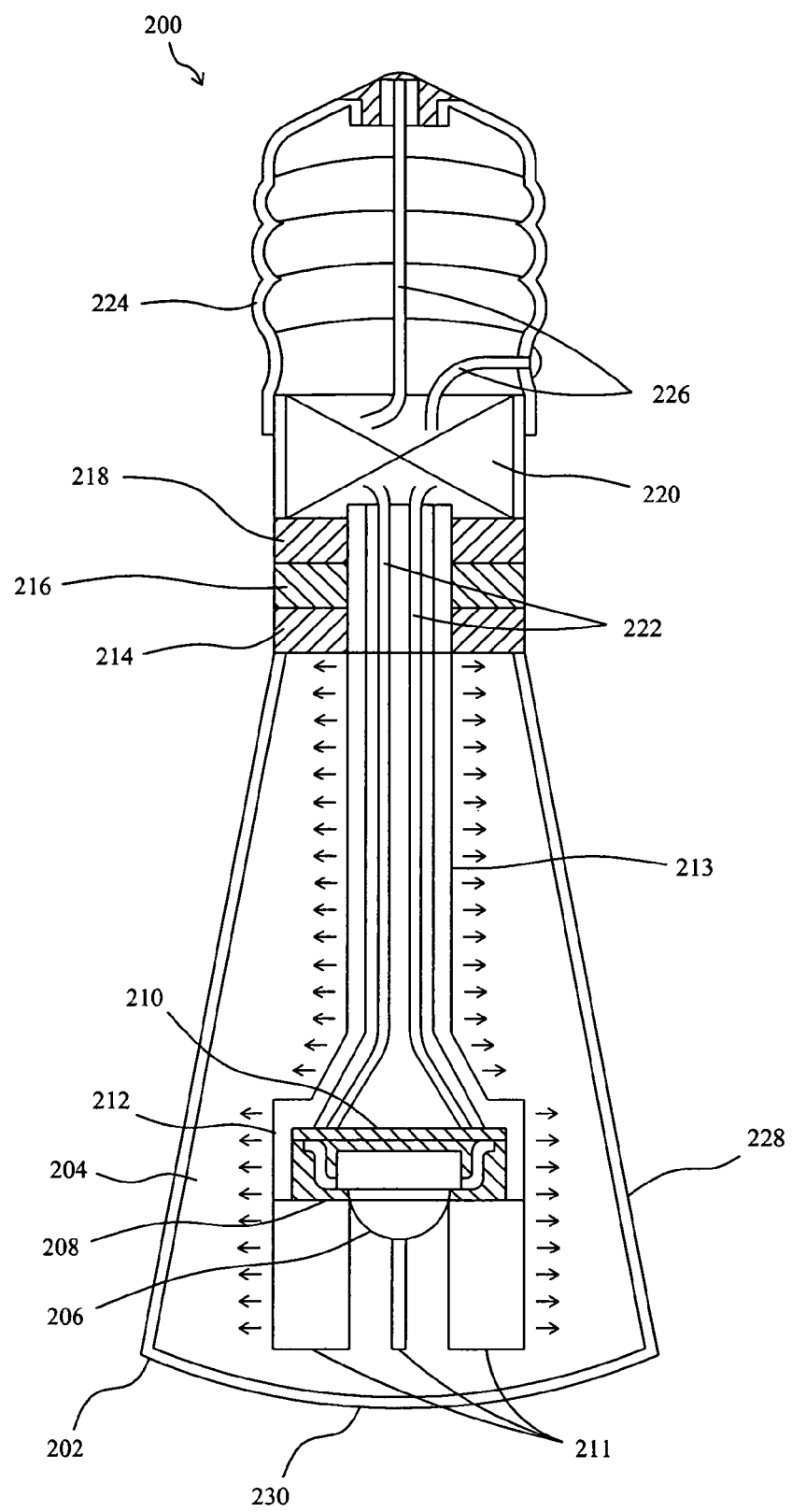
FIG. 13 shows a high power LED lamp according to the present invention.
Figure 14:
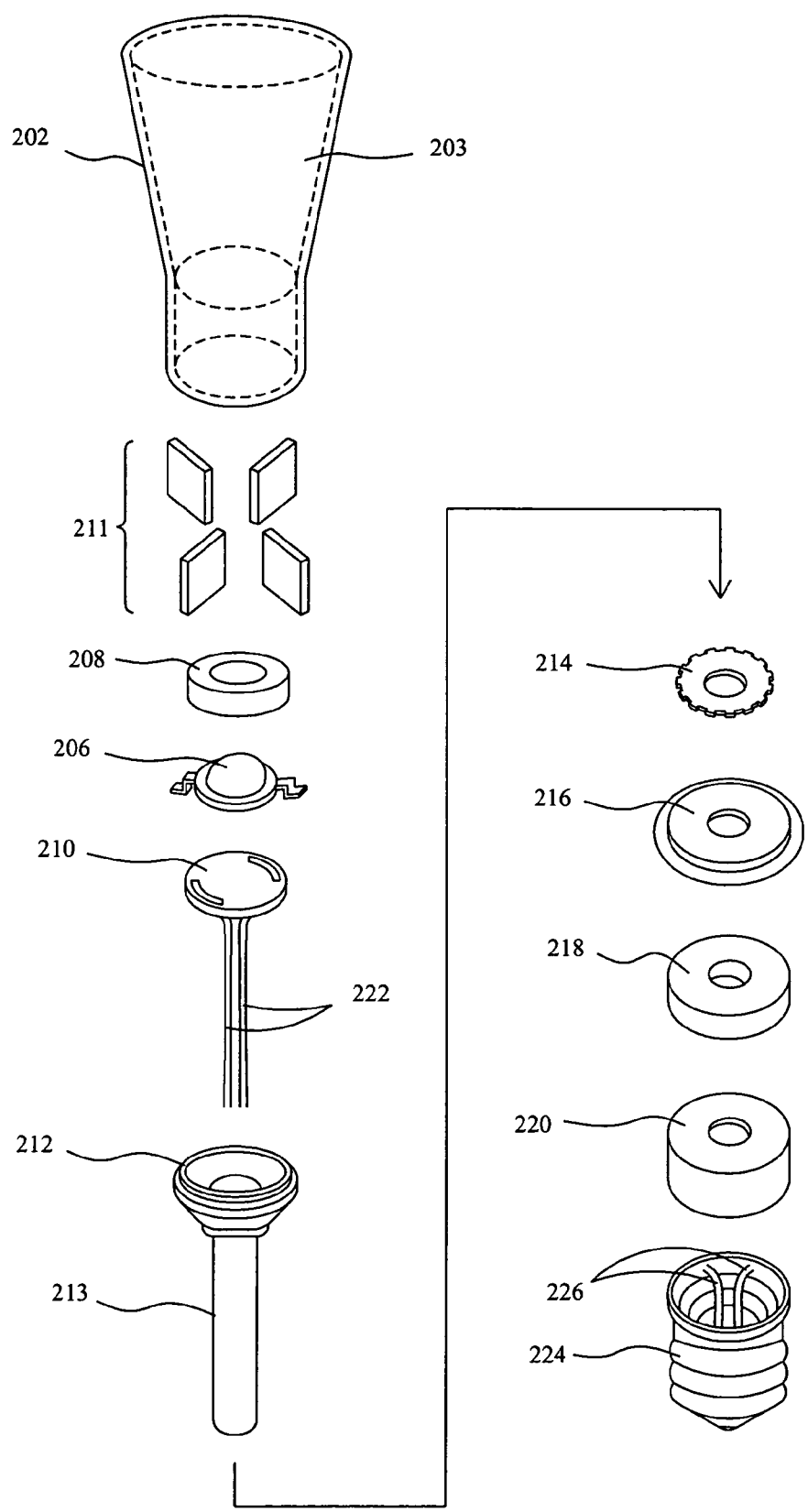
FIG. 14 shows the composition of the high power LED lamp of FIG. 13.
Figure 15:
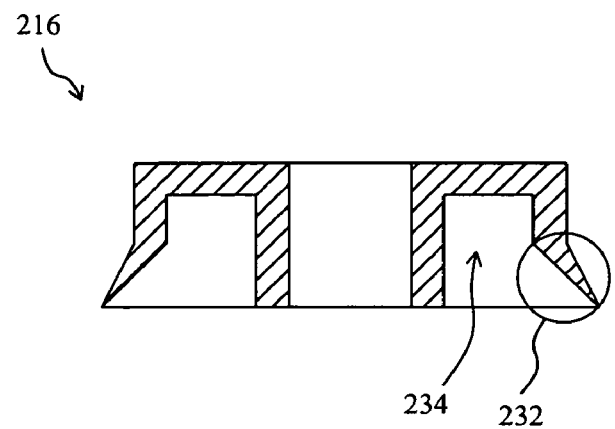
FIG. 15 shows a cross-sectional view of the sealing cap shown in FIG. 14.

FIG. 13 shows a high power LED lamp 200 according to the present invention, and FIG. 14 is a decomposition diagram. In the high power LED lamp 200, container 202 has a cavity 203 to fill with transparent or translucent liquid 204, light source module includes high power LED package 206 consuming power of for example more than 0.3 W, mounted on metal core printed circuit board 210 having power lines 222 therefrom, package resin 208 fixes the high power LED package 206 and the metal core printed circuit board 210 on carrier 212 and provides water sealing function, axial fins assembly 211 is installed in front of the high power LED package 206 and thermally connected to the carrier 212, axial thermally conductive tube 213 has one end inserted into positioning ring 214 and water sealing cap 216 and the other end thermally connected to the carrier 212 too, sealing material 218 on the sealing cap 216 seals the aperture of the container 202, and power conversion and driving module 220 is connected between the light source module and standard bulb base 224, by which the electric power from power lines 226 is converted to constant DC current through the power lines 222 to drive the high power LED package 206. The cross-sectional view of the sealing cap 216 is shown in FIG. 15, which has wedged edge 232 and trench 234 for the sealing material 218 to attain better sealing effect. Back to FIG. 13, the carrier 212, the axial thermally conductive tube 213 and the axial fins assembly 211 are all made of good thermal conductor, and the axial thermally conductive tube 213 and the axial fins assembly 211 both extend along the axial direction of the cavity 203 and has an axial length preferably between ¼ and one time of the axial length of cavity 203. The axial thermally conductive tube 213 extends in the liquid 204 at the back side of the carrier 212 and the axial fins assembly 211 extends in the liquid 204 at the front side of the carrier 212 to far away from the high power LED package 206 also, such that the heat may be conducted to the cooler portion of the liquid 204 by the axial thermally conductive tube 213 and the axial fins assembly 211. The heat produced by the high power LED package 206 is conducted through the metal core printed circuit board 210 and the carrier 212 to the axial thermally conductive tube 213 and the axial fins assembly 211, and is then transferred to the liquid 204 as shown by the arrows in FIG. 13. The liquid 204 further dissipates the heat by thermal conduction and thermal convection to the container 202 to further dissipate to the ambient air. Since the container 202 provides huge contact surface with the ambient air, the natural air convection could help to dissipate the heat significantly. As a result, the junction working temperature of the high power LED package 206 is reduced. Even though the liquid 204 has lower thermal conductivity than metal or other solid material, the axial thermally conductive tube 213 and the axial fins assembly 211 have thermal conductivity so high as to fast conduct the heat from the carrier 212 to the liquid 204 evenly, thereby enhancing the heat transformation to the liquid 204. In addition to the axial thermally conductive tube 213 and the axial fins assembly 211 to fast conduct heat to the cooler portion of the liquid 204, this structure attains convection enhancement in the liquid 204. When the high power LED package 206 is lighted up, the container 202 is similar to a boiler, since the high power LED package 206 in the middle of the liquid 204 behaves as a heat source. In this way, the high power LED package 206 warms up the neighboring portion of the liquid 204, and the warmer portion of the liquid 204 will drift upward, by which nature convection occurs in the liquid 204.

The container 202 may be selected according to the power consumption of the high power LED package 206 for smaller or larger size. Moreover, the outer surface of the container 202 is smooth, which is advantageous to airflow and thereby fast heat dissipation. The container 202 may have its sidewall 228 reflective and its front wall 230 transparent or translucent. To have the reflective sidewall 228, it may be coated with metal or optical film thereon. The container 202 is made of glass, plastic, silicone rubber or other transparent or translucent material, the carrier 212, the axial thermally conductive tube 213 and the axial fins assembly 211 are made of metal, graphite, carbon fiber, ceramic or their compound or other highly thermally conductive material, and the liquid 204 is preferably colorless, nonpoisonous and low viscosity transparent or translucent material, such as water, olive oil, paraffin oil and low viscosity lubricating oil. For use in the frigid zone which has the ambient temperature of −30° C. to 35° C., the liquid 204 is water base added with methyl alcohol, alcohol, ethylene glycol or other antifreeze. For use in the tropical zone which has the ambient temperature of 35° C. to 60° C., the liquid 204 is oil based.

Figure 16:
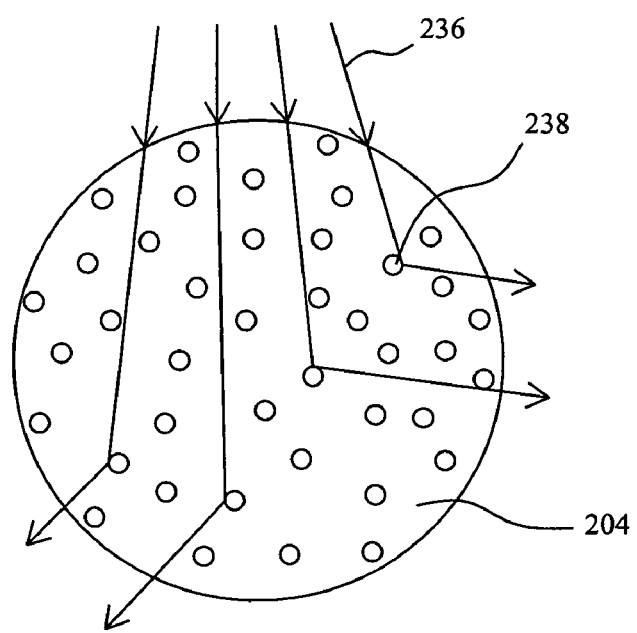
FIG. 16 shows a perspective diagram of floating dye particles for side lighting of the high power LED lamp of FIG. 13.

In some embodiments, the liquid 204 is added with tiny amount of dye, and as shown in FIG. 16, when the light 236 passes through the liquid 204, the floating dye particles 238 in the liquid 204 will produce reflection and refraction of the light 236, so as to enhance the side illumination, enlarge the lighting angle, and soften the light incident to human eyes. The dye to add in the liquid 204 may be selected from those colorful ones. For example, white dye is selected for white light or colorful light applications, and other color dye is selected consistent with the light produced by the high power LED package 206 for specific color applications. If the high power LED package 206 produces ultraviolet light, the liquid 204 may be added with phosphorescent powder or phosphorescent solution, by which the phosphorescent material will receive the ultraviolet light to release visible light. By adding various phosphorescent powder or phosphorescent solution in the liquid 204, the lamp 200 will be a colorful fluorescent lamp. Adaptive to specific application, the liquid 204 may be added with surfactant for the dye or phosphorescent powder to uniform distributed in the liquid 204.

The lamp 200 shown in FIG. 13 may be used as a spotlight (projecting lamp) or for ambient illumination. If the lamp 200 is a spotlight, the liquid 204 is transparent and without dye, and the container 202 has reflective sidewall 228. There could be arranged optical lens in front of the high power LED package 206 to guide the light emitted therefrom. If the lamp 200 is for ambient illumination, the projecting angle from the transparent front wall 230 is preferable greater than 110 degrees, the container 202 has transparent sidewall 228 and transparent front wall 230, and the liquid 204 is added with tiny amount of dye.

Figure 17:
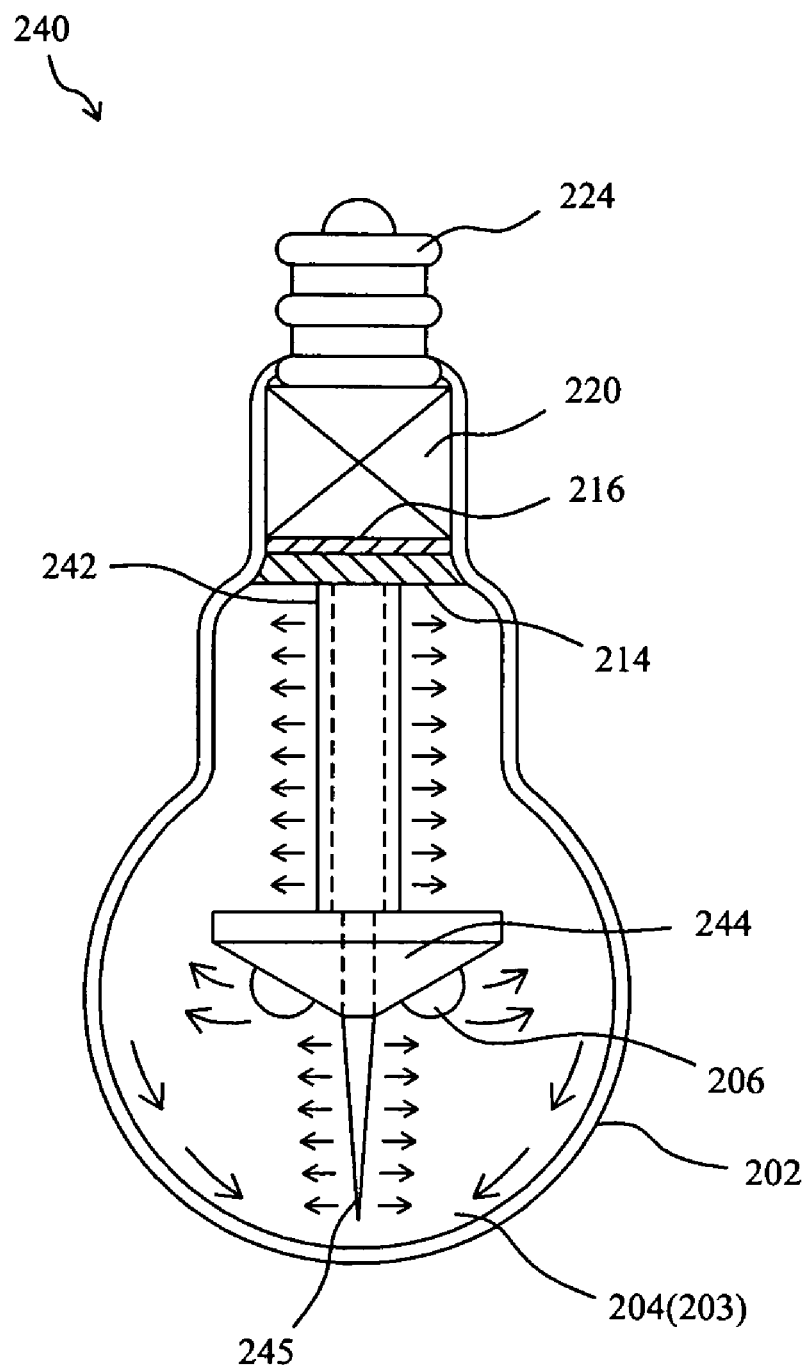
FIG. 17 shows an embodiment of the present invention for ambient lighting.

FIG. 17 shows an embodiment of the present invention for ambient lighting, which may be used to replace the conventional bulbs. Lamp 240 comprises a container 202 having a cavity 203 to fill with transparent liquid 204, light source module includes several high power LED packages 206 mounted on the conical surface of highly thermally conductive carrier 244, axial thermally conductive tube 242 fixed by positioning ring 214 is mechanically connected to the carrier 244, sealing cap 216 seals the aperture of the container 202, and power conversion and driving module 220 is connected between the high power LED packages 206 and standard bulb base 224 to produce DC current through the power lines within the axial thermally conductive tube 242 to drive the high power LED packages 206. Axial thermally conductive rod 245 is thermally connected to the carrier 244 and extends along the axial direction of the cavity 203 for heat dissipation from the carrier 244 to the liquid 204 evenly. The axial thermally conductive rod 245 has an axial length preferably between ¼ and one time of the axial length of the cavity 203 and thereby extends in the liquid 204 to far away from the high power LED packages 206 such that the heat may be fast conducted from the carrier 244 to the liquid 204. The axial thermally conductive tube 242 and the axial thermally conductive rod 245 are preferably heat pipes and made of metal, graphite, carbon fiber, ceramic or their compound. The axial thermally conductive rod 245 may have pillar shape or any other shape instead. In this embodiment, the container 202 has a transparent globe, and the liquid 204 includes tiny amount of dye. In other embodiments, the high power LED packages 206 may include various light colors, and could be lighted up all or part thereof at a time.

Figure 18:
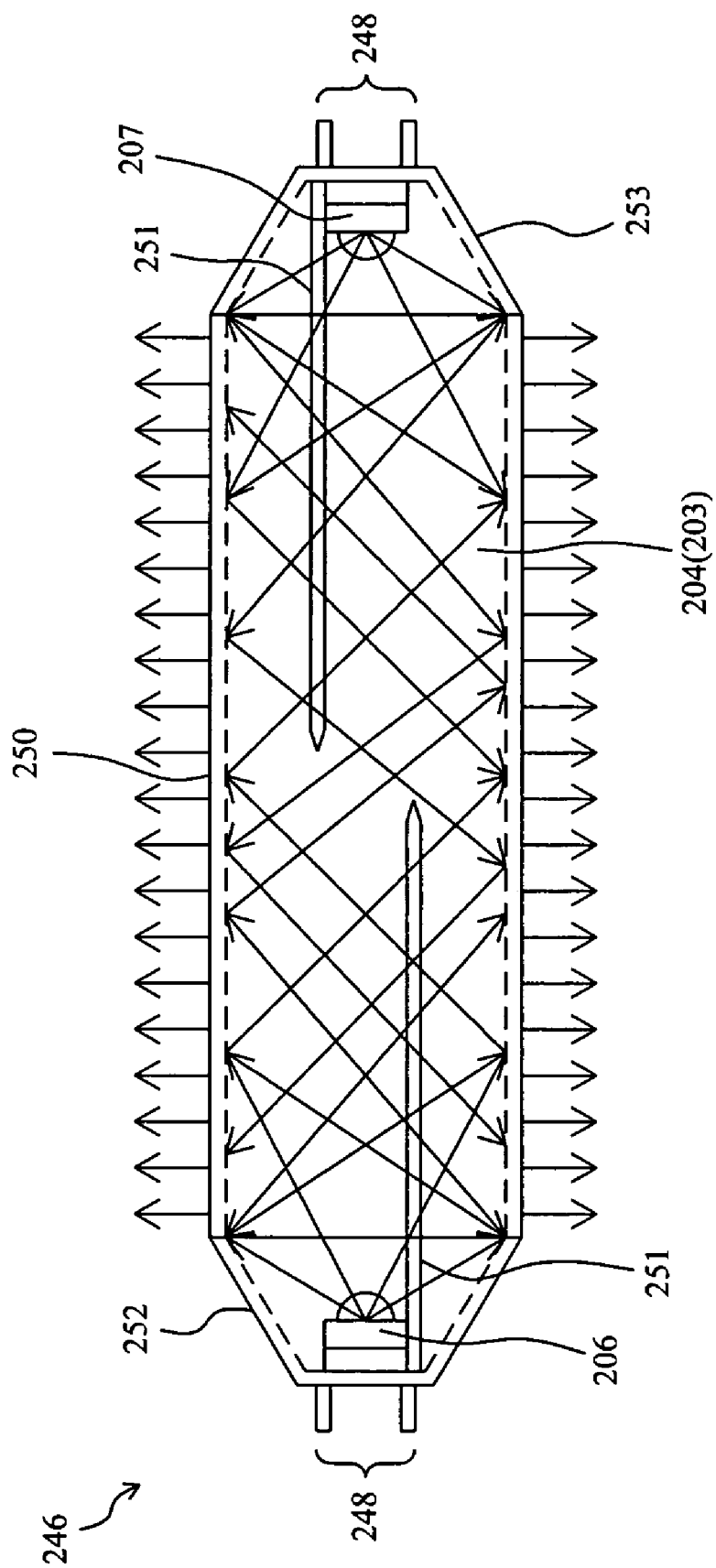
FIG. 18 shows another embodiment of the present invention for ambient lighting.

FIG. 18 shows another embodiment of the present invention for ambient lighting, which may be used to replace the conventional fluorescent lamps. In lamp 246, container includes a tube 250, light source module includes two face-to-face reflective cups 252 and 253 capping at two opposite sides of the tube 250, and two high power LED packages 206 and 207 within the reflective cups 252 and 253, respectively, transparent liquid 204 with tiny amount of dye fills in the cavity 203 of the container, and power supply devices 248 is electrically connected to the high power LED packages 206 and 207. The reflective cups 252 and 253 have light focusing effect, and the tube 250 is transparent for the light produced by the high power LED packages 206 and 207 to penetrate through. Since the high power LED packages 206 and 207 are arranged at two ends of the tube 250, some light will totally reflected by the tube 250 and reflected and refracted by the floating dye particles in the liquid 204, thereby producing uniform lighting effect from the tube 250. In this embodiment, the reflective cups 252 and 253 are made of good thermally conductive material to enhance the heat dissipation of the high power LED packages 206 and 207. However, the heat produced by the high power LED packages 206 and 207 is mainly transferred by the axial thermally conductive rods 251 to the liquid 204 evenly. The axial thermally conductive rod 251 immersed in the liquid 204 has a base connected to the carrier of either of the high power LED packages 206 and 207 and extends to far away from the high power LED packages 206 and 207 for stronger heat dissipation. The high power LED packages 206 and 207 may be lighted up either one or both.

Figure 19:
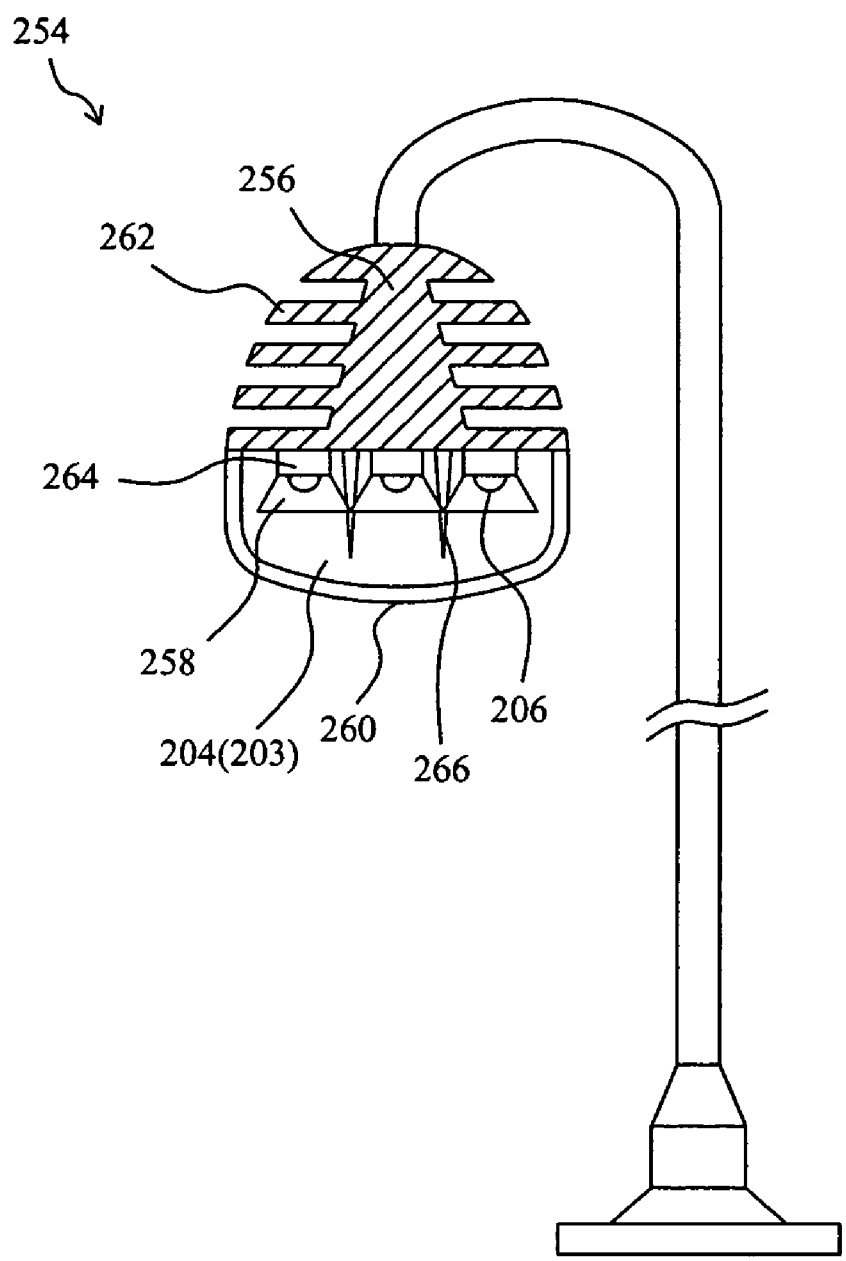
FIG. 19 shows an embodiment of the present invention for ultra high power ambient lighting.

FIG. 19 shows an embodiment of the present invention for ultra high power ambient lighting application. In lamp 254, light source module includes a few of high power LED packages 206 each mounted on a carrier 264, heat sink 256 is attached to the carriers 264 and has fins 262, several optical lens 258 are arranged in front of the high power LED packages 206 to produce desired lighting angle, and container 260 bounded to the heat sink 256 has cavity 203 to fill with transparent liquid 204. Particularly, several axial thermally conductive rods 266 are connected to the carriers 264 or the heat sink 256 for heat dissipation enhancement for the high power LED packages 206. In this embodiment, the liquid 204 in the cavity 203 is not added with dye for wider lighting angle.

Figure 20:
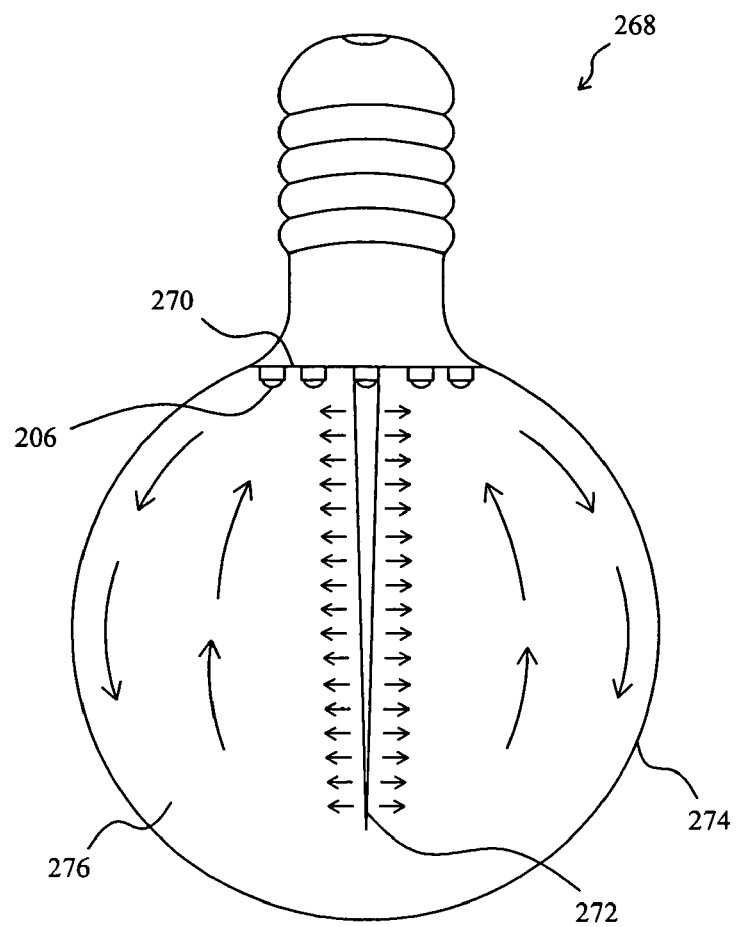
FIG. 20 shows another embodiment of the present invention for ultra high power ambient lighting.
Figure 20:
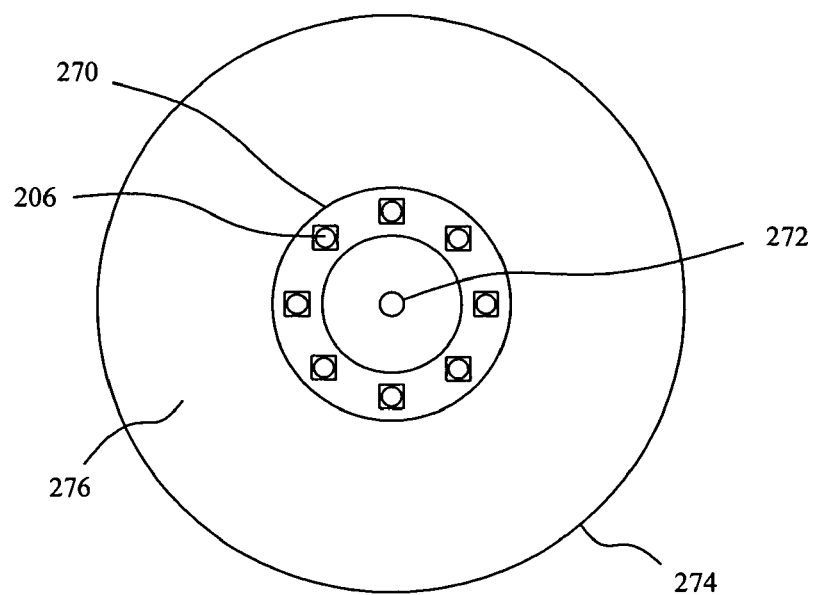

FIG. 20 shows another embodiment of the present invention for ultra high power ambient lighting. In bulb consistent lamp 268, light source module includes carrier 270 having a ring surface to mounted with a few of high power LED packages 206 thereon, and container 274 is filled with liquid 276 and bounded to the carrier 270. Other than that in the above embodiments, axial thermally conductive rod 272 has a base nearby but not directly connected to the carrier 270 and a tail extending in the liquid 276 to far away from the high power LED packages 206. During the high power LED packages 206 work, the liquid 276 nearby the high power LED packages 206 and the carrier 270 becomes hot, and the high temperature liquid 276 heats up the axial thermally conductive rod 272. Therefore, the axial thermally conductive rod 272 conducts the heat from the light source module through the liquid 276 to the container 274 evenly.

Figure 21:
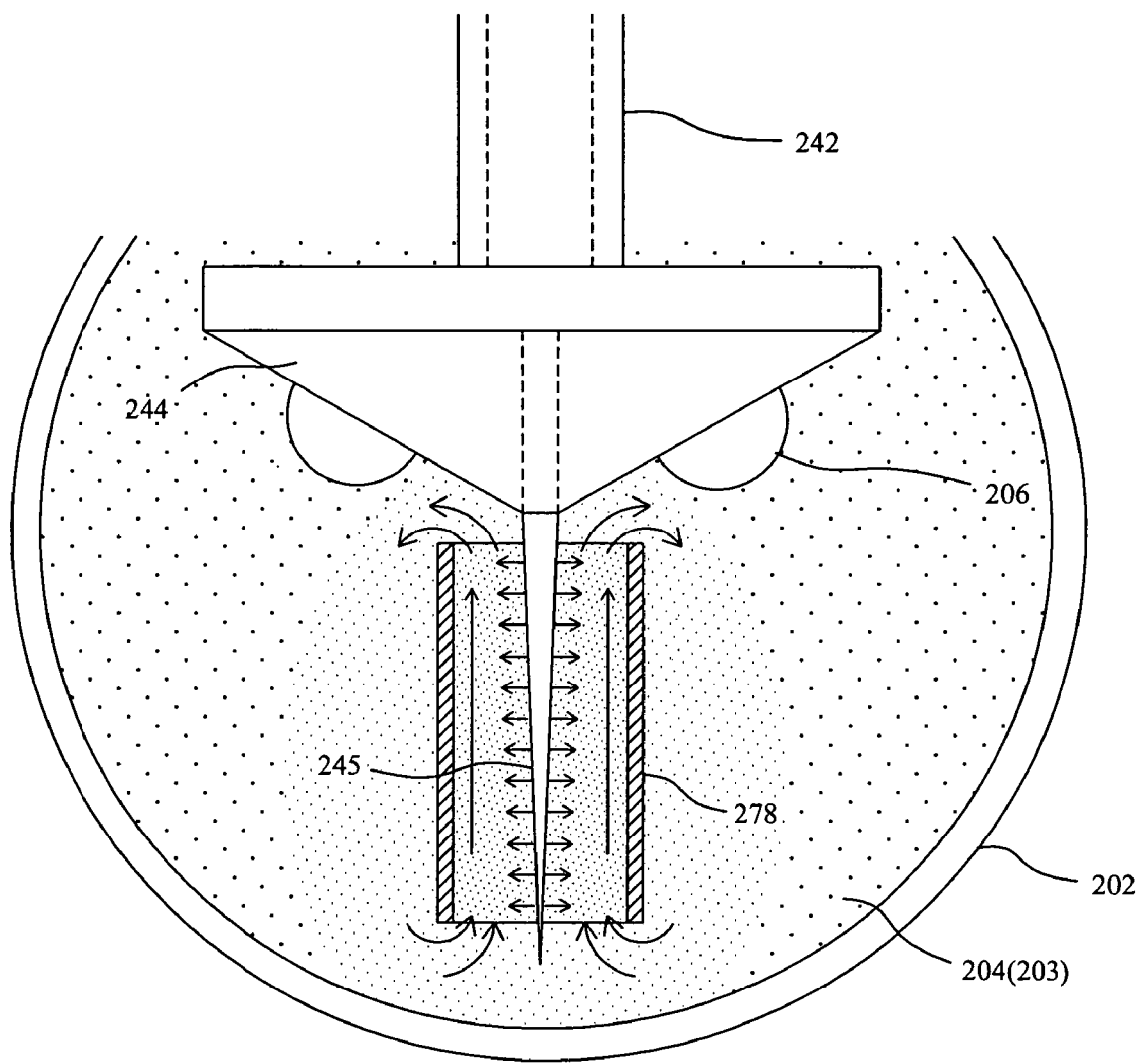
FIG. 21 shows a further enhancement of heat dissipation according to the present invention.

FIG. 21 shows a further enhancement of heat dissipation according to the present invention, which is attained by sleeving a sleeve 278 on the axial thermally conductive rod 245 of the lamp 240 shown in FIG. 17. As indicated by the arrows in FIG. 21, the axial thermally conductive rod 245 transfers the heat from the carrier 244 to the liquid 204 therearound, and the warmer liquid 204 within the sleeve 278 will drift upward, thereby causing stronger thermal convection in the liquid 204 to further enhance the heat dissipation.

Figure 22:
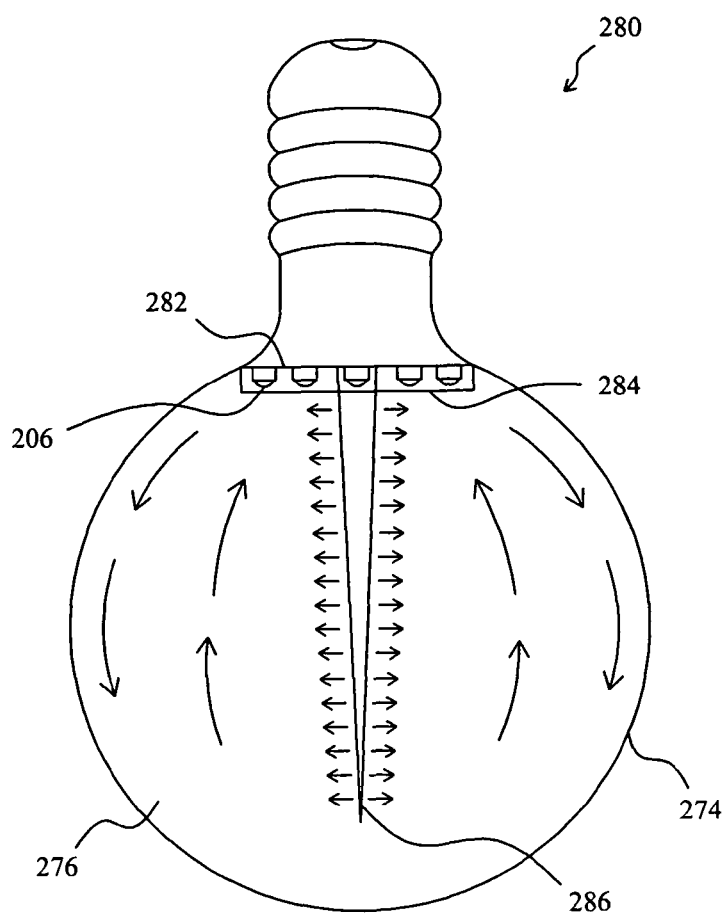
FIG. 22 shows a further embodiment of the present invention for ultra high power ambient lighting.
Figure 22:
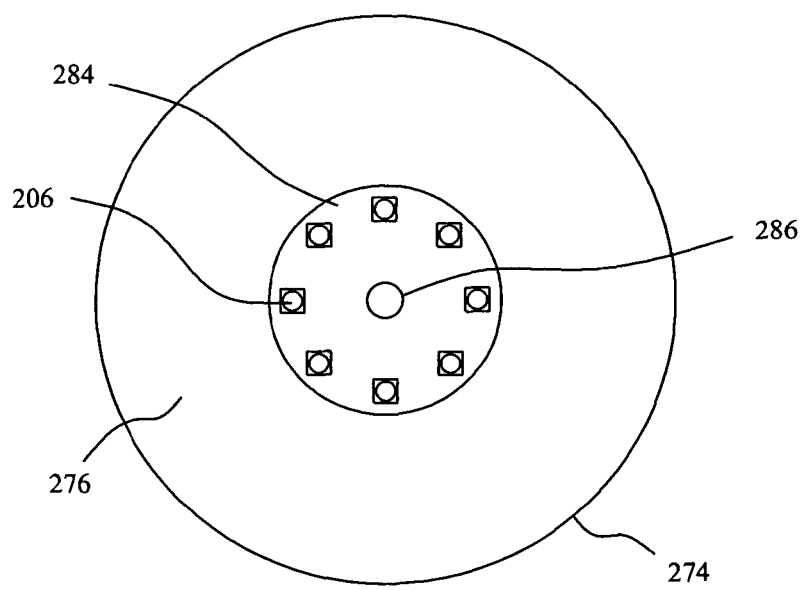

FIG. 22 shows another bulb consistent lamp 280, in which light source module includes carrier 282 having a disc surface to mount a few of high power LED packages 206, cap 284 covers over the high power LED packages 206 such that the high power LED packages 206 and the carrier 282 are not directly contacted by the liquid 276, container 274 is bounded to the carrier 270 and has a cavity filled with the liquid 276, and axial thermally conductive rod 286 is thermally connected to the carrier 270 to conduct the heat from the carrier 270 through the liquid 276 to the container 274 evenly. The axial thermally conductive rod 286 extends in the liquid 276 to far away from the high power LED packages 206 and the carrier 282.

According to the present invention, it is the axial thermal conductor immersed in the liquid for primarily dissipating the heat from the working LED package through the liquid to the container evenly. The axial thermal conductor in the lamp of the present invention may comprise heat pipe, may have tube, rod, pillar or fins shape, and may be flexible or rigid. The axial thermal conductor may or may not be directly connected to the carrier. If the high power LED package and the carrier do not directly contact the liquid, the axial thermal conductor is preferably thermally connected to the carrier for good receiving the heat from the carrier. If the high power LED package and/or the carrier directly contact the liquid, the axial thermal conductor may only have a first portion immersed in the liquid nearby the carrier for good receiving the heat from the carrier and the high power LED package through the hot liquid therearound, and a second portion extending in the liquid to far away from the carrier and the high power LED package.

According to the present invention, adaptive to applications or requirements for high power LED in various illumination purposes, the material of liquid is easily to change and the geometric structure, such as size and shape, of the container can be changed for fast heat dissipation and optimized illumination optics.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An LED lamp, comprising:
   a container having a cavity;
   a liquid in the cavity;
   a thermal conductive carrier immersed in the liquid;
   a thermal conductive rod connected to a central portion of a front surface of the thermal conductive carrier, a long axis of the thermal conductive rod being substantially perpendicular to the front surface; and
   an LED light source module disposed on the front surface.

2. The lamp of claim 1, wherein the front surface comprising a conical surface and the LED light source module is disposed on the conical surface.

3. The lamp of claim 1, wherein the thermal conductive carrier has a second surface opposite to the front surface and a thermal conductive tube is connected to the second surface.

4. The lamp of claim 1, wherein a length of the thermal conductive rod is equal to or greater than one fourth the length of the cavity.

5. The lamp of claim 1, wherein a portion of the thermal conductive rod along the long axis is sleeved by a sleeve.

6. An LED lamp, comprising:
   a container having a cavity;
   a liquid in the cavity;
   a light source module disposed in the cavity and having a front surface surrounded by the liquid;
   an LED light source enclosed within the light source module and configured to provide light to the liquid through the front surface of the light source module, the front surface being interposed between the liquid and the LED light source; and
   a thermal conductor substantially enclosed in the cavity and having a first portion disposed adjacent the light source module and a second portion extending from the first portion in front of the light source module in a direction substantially parallel to a normal direction of a central portion of the front surface, at least a portion of the thermal conductor being immersed in the liquid.

7. The lamp of claim 6, wherein at least a portion of the thermal conductor has a rod shape.

8. The lamp of claim 6, wherein at least a portion of the thermal conductor has a tube shape.

9. The lamp of claim 6, wherein at least a portion of the thermal conductor has a pillar shape.

10. The lamp of claim 6, wherein at least a portion of the thermal conductor has a fin shape.

11. The lamp of claim 6, wherein the thermal conductor comprises a heat pipe.

12. The lamp of claim 6, further comprising a sleeve on the thermal conductor.

13. The lamp of claim 6, further comprising an optical lens in the cavity for guiding the high power LED light source .

14. The lamp of claim 6, wherein the light source module comprises a thermally conductive carrier.

15. The lamp of claim 14, further comprising a cap for separating the thermally conductive carrier and the high power LED light source from the liquid.

16. The lamp of claim 14, wherein the thermally conductive carrier is thermally connected to the first portion of the thermal conductor.

17. The lamp of claim 16, wherein the thermally conductive carrier and the first portion of the thermal conductor both directly contact the liquid.

18. The lamp of claim 14, wherein the thermally conductive carrier is nearby but not connected to the first portion of the thermal conductor.

19. The lamp of claim 18, wherein the thermally conductive carrier and the first portion of the thermal conductor both directly contact the liquid.

* * * * *